(12) United States Patent
Yang et al.

(10) Patent No.: US 10,756,140 B2
(45) Date of Patent: Aug. 25, 2020

(54) PLURALITY OF STACKED ORGANIC LIGHT EMITTING LAYERS IN A LIGHT EMITTING DIODE DISPLAY

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhaokun Yang, Beijing (CN); Xiang Feng, Beijing (CN); Ruizhi Yang, Beijing (CN); Lianjie Qu, Beijing (CN); Sha Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 367 days.

(21) Appl. No.: 15/761,284

(22) PCT Filed: Apr. 12, 2017

(86) PCT No.: PCT/CN2017/080240
§ 371 (c)(1),
(2) Date: Mar. 19, 2018

(87) PCT Pub. No.: WO2018/187966
PCT Pub. Date: Oct. 18, 2018

(65) Prior Publication Data
US 2020/0243614 A1    Jul. 30, 2020

(51) Int. Cl.
*H01L 29/08* (2006.01)
*H01L 33/00* (2010.01)
(Continued)

(52) U.S. Cl.
CPC ...... *H01L 27/3209* (2013.01); *H01L 27/3218* (2013.01); *H01L 27/3258* (2013.01);
(Continued)

(58) Field of Classification Search
CPC ............. H01L 27/3258; H01L 27/3209; H01L 27/3276; H01L 27/3262; H01L 27/3211; H01L 27/3218
See application file for complete search history.

(56) References Cited

U.S. PATENT DOCUMENTS 5,721,160 A    2/1998 Forrest et al.
5,917,280 A    6/1999 Burrows et al.
(Continued)

FOREIGN PATENT DOCUMENTS

CN    1293425 A    5/2001
CN    101371619 A    2/2009
(Continued)

OTHER PUBLICATIONS

International Search Report & Written Opinion dated Jan. 15, 2018, regarding PCT/CN2017/080240.
(Continued)

*Primary Examiner* — Alonzo Chambliss
(74) *Attorney, Agent, or Firm* — Intellectual Valley Law, P.C.

(57) ABSTRACT

The present application discloses a stacked organic light emitting apparatus including a base substrate; and at least two organic light emitting diodes. The at least two organic light emitting diodes include a first organic light emitting diode and a second organic light emitting diode. The first organic light emitting diode includes a first electrode layer on the base substrate; a first light emitting layer of a first color on a side of the first electrode layer distal to the base substrate; and a second electrode layer on a side of the first
(Continued)

light emitting layer distal to the first electrode layer. The second organic light emitting diode includes a third electrode layer on a side of the second electrode layer distal to the first light emitting layer; a second light emitting layer of a second color on a side of the third electrode layer distal to the second electrode layer; and a fourth electrode layer on a side of the second light emitting layer distal to the third electrode layer.

20 Claims, 6 Drawing Sheets

(51) Int. Cl.
*H01L 31/0232* (2014.01)
*H01L 21/00* (2006.01)
*H01L 51/40* (2006.01)
*H01L 27/32* (2006.01)
*H01L 51/56* (2006.01)

(52) U.S. Cl.
CPC ...... *H01L 27/3262* (2013.01); *H01L 27/3276* (2013.01); *H01L 51/56* (2013.01); *H01L 27/3211* (2013.01); *H01L 2227/323* (2013.01)

(56) References Cited

U.S. PATENT DOCUMENTS

| | | | |
|---|---|---|---|
| 10,290,826 B2* | 5/2019 | Kim | H01L 27/3209 |
| 2004/0251820 A1 | 12/2004 | Cok et al. | |
| 2014/0183475 A1* | 7/2014 | Song | H01L 51/5278 |
| | | | 257/40 |
| 2015/0060825 A1* | 3/2015 | Song | H01L 51/5278 |
| | | | 257/40 |
| 2016/0293083 A1 | 10/2016 | Yang et al. | |
| 2017/0287985 A1* | 10/2017 | Kim | H01L 51/5278 |

FOREIGN PATENT DOCUMENTS

| | | |
|---|---|---|
| CN | 106449659 A | 2/2017 |
| EP | 3154089 A1 | 4/2017 |

OTHER PUBLICATIONS

First Office Action in the Indian Patent Application No. 201827019722 dated Jul. 8, 2020; English translation attached.

* cited by examiner

PLURALITY OF STACKED ORGANIC LIGHT EMITTING LAYERS IN A LIGHT EMITTING DIODE DISPLAY

CROSS-REFERENCE TO RELATED APPLICATION

This application is a national stage application under 35 U.S.C. § 371 of International Application No. PCT/CN2017/080240, filed Apr. 12, 2017, the contents of which are incorporated by reference in the entirety.

TECHNICAL FIELD

The present invention relates to display technology, more particularly, to a stacked organic light emitting apparatus, an organic light emitting diode display apparatus, and a method of fabricating a stacked organic light emitting apparatus.

BACKGROUND

As compared to other display devices such as liquid crystal display (LCD) devices, the organic light emitting diode (OLED) display devices are self-emitting apparatuses that do not require a backlight. Having the advantages of fast response, a wider viewing angle, high brightness, more vivid color rendering, thinner and lighter, they have found a wide range of applications in display field.

Typically, a convention OLED includes an anode, a light emitting layer and a cathode. The light emitting layer often includes a light emitting layer (EML), and optionally one or more of a hole injection layer (HIL), a hole transport layer (HTL), an electron transport layer (ETL), and an electrode injection layer (EIL). When a voltage is applied between the cathode and the anode, charge carriers (electrons and holes) are injected from the cathode and the anode into the emitting layer. The electrons and holes are recombined in the emitting layer, which emits light.

SUMMARY

In one aspect, the present invention provides a stacked organic light emitting apparatus, comprising a base substrate; and at least two organic light emitting diodes; wherein the at least two organic light emitting diodes comprises a first organic light emitting diode comprising a first electrode layer on the base substrate; a first light emitting layer of a first color on a side of the first electrode layer distal to the base substrate; and a second electrode layer on a side of the first light emitting layer distal to the first electrode layer; and a second organic light emitting diode comprising a third electrode layer on a side of the second electrode layer distal to the first light emitting layer; a second light emitting layer of a second color on a side of the third electrode layer distal to the second electrode layer; and a fourth electrode layer on a side of the second light emitting layer distal to the third electrode layer; the stacked organic light emitting apparatus further comprising a first insulating layer between the second electrode layer and the third electrode layer and insulating the second electrode layer from the third electrode layer; a gate line; a first data line; a second data line; a first switching thin film transistor for controlling the first organic light emitting diode comprising a first gate electrode, a first source electrode coupled to the first data line, and a first drain electrode coupled to an anode of the first organic light emitting diode; and a second switching thin film transistor for controlling the second organic light emitting diode comprising a second gate electrode, a second source electrode coupled to the second data line, and a second drain electrode coupled to an anode of the second organic light emitting diode; wherein the first gate electrode and the second gate electrode are commonly coupled to the gate line; one of the first electrode layer and the second electrode layer is a cathode of the first organic light emitting diode, another one of the first electrode layer and the second electrode layer is the anode of the first organic light emitting diode; one of the third electrode layer and the fourth electrode layer is a cathode of the second organic light emitting diode, another one of the third electrode layer and the fourth electrode layer is the anode of the second organic light emitting diode; and the first data line is insulated from the second drain electrode and a signal line connecting the second drain electrode and the anode of the second organic light emitting diode.

Optionally, the at least two organic light emitting diodes further comprises a third organic light emitting diode comprising a fifth electrode layer on a side of the fourth electrode layer distal to the second light emitting layer; a third light emitting layer of a third color on a side of the fifth electrode layer distal to the fourth electrode layer; and a sixth electrode layer on a side of the third light emitting layer distal to the fifth electrode layer; the stacked organic light emitting apparatus further comprising a third data line; and a third switching thin film transistor for controlling the third organic light emitting diode comprising a third gate electrode, a third source electrode coupled to the third data line, and a third drain electrode coupled to an anode of the third organic light emitting diode; wherein the first gate electrode, the second gate electrode, and the third gate electrode are commonly coupled to the gate line; and one of the fifth electrode layer and the sixth electrode layer is a cathode of the third organic light emitting diode, another one of the fifth electrode layer and the sixth electrode layer is the anode of the third organic light emitting diode.

Optionally, the stacked organic light emitting apparatus further comprises a second insulating layer between the fourth electrode layer and the fifth electrode layer and insulating the fourth electrode layer from the fifth electrode layer.

Optionally, the first data line and the second data line are insulated from the third drain electrode and a signal line connecting the third drain electrode and the anode of the third organic light emitting diode.

Optionally, a portion of the first insulating layer is between the first data line and the second drain electrode thereby insulating the first data line from the second drain electrode and the signal line connecting the second drain electrode and the anode of the second organic light emitting diode.

Optionally, a portion of the first insulating layer is between the first data line and a signal line connecting the second drain electrode and the anode of the second organic light emitting diode thereby insulating the first data line from the second drain electrode and the signal line connecting the second drain electrode and the anode of the second organic light emitting diode.

Optionally, a portion of the second insulating layer is between the first data line and the third drain electrode and between the second data line and the third drain electrode, thereby insulating the first data line and the second data line from the third drain electrode and the signal line connecting the third drain electrode and the anode of the third organic light emitting diode.

Optionally, a portion of the second insulating layer is between the first data line and a signal line connecting the third drain electrode and the anode of the third organic light emitting diode, and between the second data line and the signal line connecting the third drain electrode and the anode of the third organic light emitting diode, thereby insulating the first data line and the second data line from the third drain electrode and the signal line connecting the third drain electrode and the anode of the third organic light emitting diode.

Optionally, the stacked organic light emitting apparatus further comprises a third insulating layer insulating the first data line from the second drain electrode and the signal line connecting the second drain electrode and the anode of the second organic light emitting diode; and a fourth insulating layer insulating the first data line and the second data line from the third drain electrode and the signal line connecting the third drain electrode and the anode of the third organic light emitting diode.

Optionally, the first electrode layer is the anode of the first organic light emitting diode, the third electrode layer is the anode of the second organic light emitting diode, and the fifth electrode layer is the anode of the third organic light emitting diode.

Optionally, the second electrode layer is the anode of the first organic light emitting diode, the fourth electrode layer is the anode of the second organic light emitting diode, and the sixth electrode layer is the anode of the third organic light emitting diode.

Optionally, the cathode of the first organic light emitting diode, the cathode of the second organic light emitting diode, and the cathode of the third organic light emitting diode are electrically connected to ground.

Optionally, the second electrode layer, the third electrode layer, the fourth electrode layer, the fifth electrode layer, and the sixth electrode layer are transparent electrode layers; and the first insulating layer and the second insulating layer are transparent insulating layers.

Optionally, the first electrode layer, the second electrode layer, the third electrode layer, the fourth electrode layer, and the fifth electrode layer, are transparent electrode layers; and the first insulating layer and the second insulating layer are transparent insulating layers.

Optionally, the first electrode layer, the second electrode layer, the third electrode layer, the fourth electrode layer, the fifth electrode layer, and the sixth electrode layer are transparent electrode layers; and the first insulating layer and the second insulating layer are transparent insulating layers.

Optionally, the first color, the second color, and the third color are three different colors selected from the group consisting of red, green, and blue.

Optionally, an emission spectrum of the blue light emitting layer minimally overlaps with absorption spectrums of the red light emitting layer and the green light emitting layer; and an emission spectrum of the green light emitting layer minimally overlaps with an absorption spectrum of the red light emitting layer.

In another aspect, the present invention provides a stacked organic light emitting apparatus, comprising a base substrate; a first organic light emitting diode comprising a first anode on the base substrate; a first light emitting layer of a first color on a side of the first anode distal to the base substrate; and a first cathode on a side of the first light emitting layer distal to the first anode; a second organic light emitting diode comprising a second anode on a side of the first cathode distal to the first light emitting layer, a second light emitting layer of a second color on a side of the second anode distal to the first cathode; and a second cathode on a side of the second light emitting layer distal to the second anode; and a third organic light emitting diode comprising a third anode on a side of the second cathode distal to the second light emitting layer; a third light emitting layer of a third color on a side of the third anode distal to the second cathode; and a third cathode on a side of the third light emitting layer distal to the third anode; a first insulating layer between the first cathode and the second anode and insulating the first cathode from the second anode; and a second insulating layer between the second cathode and the third anode and insulating the second cathode from the third anode; a gate line; a first data line; a second data line; a third data line; a first switching thin film transistor for controlling the first organic light emitting diode comprising a first gate electrode, a first source electrode coupled to the first data line, and a first drain electrode coupled to the first anode; a second switching thin film transistor for controlling the second organic light emitting diode comprising a second gate electrode, a second source electrode coupled to the second data line, and a second drain electrode coupled to the second anode; a third switching thin film transistor for controlling the third organic light emitting diode comprising a third gate electrode, a third source electrode coupled to the third data line, and a third drain electrode coupled to the third anode; wherein the first gate electrode, the second gate electrode, and the third gate electrode are commonly coupled to the gate line; the first cathode, the second cathode, and the third cathode are electrically connected to ground; a portion of the first insulating layer is between the first data line and the second drain electrode, and insulates the first data line from the second drain electrode; and a portion of the second insulating layer is between the first data line and the third drain electrode and between the second data line and the third drain electrode, and insulates the first data line and the second data line from the third drain electrode.

In another aspect, the present invention provides an organic light emitting diode display apparatus, comprising a plurality of pixels, each of the plurality of pixels comprises the stacked organic light emitting apparatus described herein.

In another aspect, the present invention provides a method of fabricating a stacked organic light emitting apparatus, comprising forming a first organic light emitting diode comprising forming a first electrode layer on a base substrate; forming a first light emitting layer of a first color on a side of the first electrode layer distal to the base substrate; and forming a second electrode layer on a side of the first light emitting layer distal to the first electrode layer; forming a first insulating layer on a side of the second electrode layer distal to the first light emitting layer; forming a second organic light emitting diode comprising forming a third electrode layer on a side of the first insulating layer distal to the second electrode layer; forming a second light emitting layer of a second color on a side of the third electrode layer distal to the first insulating layer; and forming a fourth electrode layer on a side of the second light emitting layer distal to the third electrode layer; forming a gate line; forming a first data line; forming a second data line; forming a first switching thin film transistor for controlling the first organic light emitting diode comprising forming a first gate electrode, forming a first source electrode coupled to the first data line, and forming a first drain electrode coupled to an anode of the first organic light emitting diode; and forming a second switching thin film transistor for controlling the second organic light emitting diode comprising forming a second gate electrode, forming a second source electrode coupled to the second data line, and forming a second drain electrode coupled to an anode of the second organic light emitting diode; and wherein the first gate electrode and the second gate electrode are formed to be commonly coupled to the gate line; one of the first electrode layer and the second electrode layer is a cathode of the first organic light emitting diode, another one of the first electrode layer and the second electrode layer is the anode of the first organic light emitting diode; one of the third electrode layer and the fourth electrode layer is a cathode of the second organic light emitting diode, another one of the third electrode layer and the fourth electrode layer is the anode of the second organic light emitting diode; the first insulating layer is formed to insulate the second electrode layer from the third electrode layer; the first data line is formed to be insulated from the second drain electrode and a signal line connecting the second drain electrode and the anode of the second organic light emitting diode.

Optionally, the method further comprises forming a second insulating layer on a side of the fourth electrode layer distal to the second light emitting layer; forming a third organic light emitting diode comprising forming a fifth electrode layer on a side of the second insulating layer distal to the fourth electrode layer; forming a third light emitting layer of a third color on a side of the fifth electrode layer distal to the second insulating layer; and forming a sixth electrode layer on a side of the third light emitting layer distal to the fifth electrode layer; forming a third data line; forming a third switching thin film transistor for controlling the third organic light emitting diode comprising forming a third gate electrode, forming a third source electrode coupled to the third data line, and forming a third drain electrode coupled to an anode of the third organic light emitting diode; wherein the first gate electrode, the second gate electrode, and the third gate electrode are formed to be commonly coupled to the gate line; one of the fifth electrode layer and the sixth electrode layer is a cathode of the third organic light emitting diode, another one of the fifth electrode layer and the sixth electrode layer is the anode of the third organic light emitting diode; the second insulating layer is formed to insulate the fourth electrode layer from the fifth electrode layer; the first data line and the second data line are formed to be insulated from the third drain electrode and a signal line connecting the third drain electrode and the anode of the third organic light emitting diode.

Optionally, the method further comprises forming a third insulating layer insulating the first data line from the second drain electrode and the signal line connecting the second drain electrode and the anode of the second organic light emitting diode; and forming a fourth insulating layer insulating the first data line and the second data line from the third drain electrode and the signal line connecting the third drain electrode and the anode of the third organic light emitting diode.

Optionally, a portion of the first insulating layer is formed between the first data line and the second drain electrode thereby insulating the first data line from the second drain electrode and the signal line connecting the second drain electrode and the anode of the second organic light emitting diode; and a portion of the second insulating layer is formed between the first data line and the third drain electrode and between the second data line and the third drain electrode, thereby insulating the first data line and the second data line from the third drain electrode and the signal line connecting the third drain electrode and the anode of the third organic light emitting diode.

Optionally, a portion of the first insulating layer is formed between the first data line and a signal line connecting the second drain electrode and the anode of the second organic light emitting diode thereby insulating the first data line from the second drain electrode and the signal line connecting the second drain electrode and the anode of the second organic light emitting diode; and a portion of the second insulating layer is formed between the first data line and a signal line connecting the third drain electrode and the anode of the third organic light emitting diode, and between the second data line and the signal line connecting the third drain electrode and the anode of the third organic light emitting diode, thereby insulating the first data line and the second data line from the third drain electrode and the signal line connecting the third drain electrode and the anode of the third organic light emitting diode.

Optionally, forming the first drain electrode, forming the second drain electrode, and forming the third drain electrode are performed prior to the step of forming the third organic light emitting diode.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
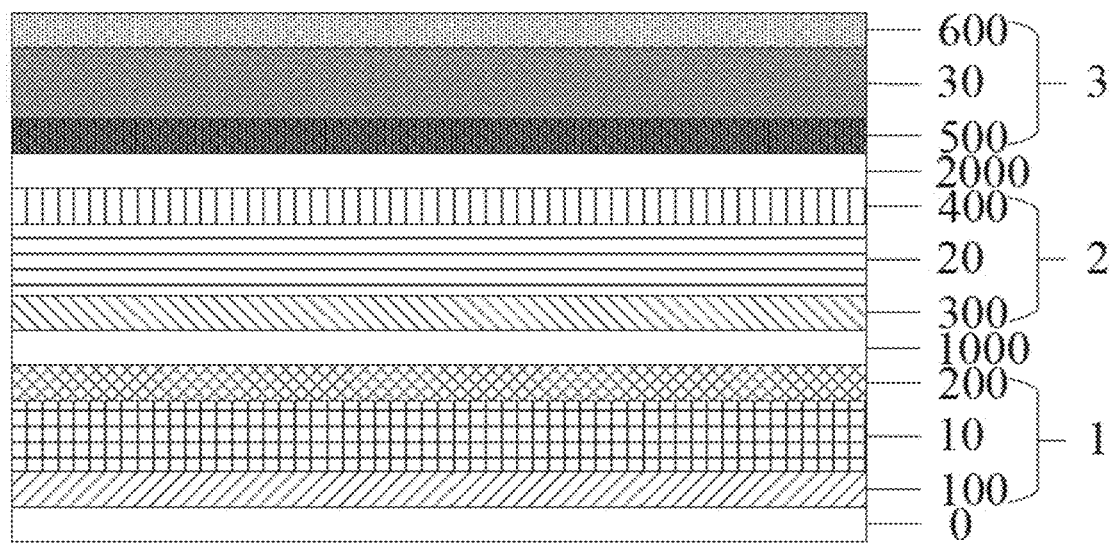
FIG. 1 is a schematic diagram illustrating the structure of a stacked organic light emitting apparatus.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional organic light emitting diodes typically include a cathode and an anode, and light emitting units between the cathode and the anode. An OLED can be a single unit OLED or a tandem OLED. A single unit OLED has only one light emitting unit, which includes a hole injection layer, a hole transport layer, an emitting material layer, an electron transport layer, and an electron injection layer. A tandem OLED has multiple light emitting units connected in series between the cathode and the anode. Image display resolution in conventional organic light emitting diodes display apparatuses are limited.

Accordingly, the present disclosure provides, inter alia, a stacked organic light emitting apparatus, an organic light emitting diode display apparatus, and a method of fabricating a stacked organic light emitting apparatus that substantially obviate one or more of the problems due to limitations and disadvantages of the related art. In one aspect, the present disclosure provides a stacked organic light emitting apparatus. In some embodiments, the stacked organic light emitting apparatus includes a base substrate; and at least two organic light emitting diodes; the at least two organic light emitting diodes include a first organic light emitting diode including a first electrode layer on the base substrate; a first light emitting layer of a first color on a side of the first electrode layer distal to the base substrate; and a second electrode layer on a side of the first light emitting layer distal to the first electrode layer; and a second organic light emitting diode including a third electrode layer on a side of the second electrode layer distal to the first light emitting layer; a second light emitting layer of a second color on a side of the third electrode layer distal to the second electrode layer; and a fourth electrode layer on a side of the second light emitting layer distal to the third electrode layer. Optionally, one of the first electrode layer and the second electrode layer is a cathode of the first organic light emitting diode, another one of the first electrode layer and the second electrode layer is an anode of the first organic light emitting diode. Optionally, one of the third electrode layer and the fourth electrode layer is a cathode of the second organic light emitting diode, another one of the third electrode layer and the fourth electrode layer is an anode of the second organic light emitting diode. Optionally, the stacked organic light emitting apparatus further includes a first insulating layer between the second electrode layer and the third electrode layer and insulating the second electrode layer from the third electrode layer; a gate line; a first data line; a second data line; a first switching thin film transistor for controlling the first organic light emitting diode comprising a first gate electrode, a first source electrode coupled to the first data line, and a first drain electrode coupled to the anode of the first organic light emitting diode; and a second switching thin film transistor for controlling the second organic light emitting diode comprising a second gate electrode, a second source electrode coupled to the second data line, and a second drain electrode coupled to the anode of the second organic light emitting diode. Optionally, the first gate electrode and the second gate electrode are commonly coupled to the gate line. Optionally, the first data line is insulated from the second drain electrode and a signal line connecting the second drain electrode and the anode of the second organic light emitting diode. Optionally, a portion of the first insulating layer is between the first data line and the second drain electrode thereby insulating the first data line from the second drain electrode and the signal line connecting the second drain electrode and the anode of the second organic light emitting diode. Optionally, a portion of the first insulating layer is between the first data line and a signal line connecting the second drain electrode and the anode of the second organic light emitting diode thereby insulating the first data line from the second drain electrode and the signal line connecting the second drain electrode and the anode of the second organic light emitting diode.

In some embodiments, the at least two organic light emitting diodes further include a third organic light emitting diode comprising a fifth electrode layer on a side of the fourth electrode layer distal to the second light emitting layer; a third light emitting layer of a third color on a side of the fifth electrode layer distal to the fourth electrode layer; and a sixth electrode layer on a side of the third light emitting layer distal to the fifth electrode layer. Optionally, one of the fifth electrode layer and the sixth electrode layer is a cathode of the third organic light emitting diode, another one of the fifth electrode layer and the sixth electrode layer is an anode of the third organic light emitting diode. Optionally, the stacked organic light emitting apparatus further includes a third data line; and a third switching thin film transistor for controlling the third organic light emitting diode comprising a third gate electrode, a third source electrode coupled to the third data line, and a third drain electrode coupled to the anode of the third organic light emitting diode. Optionally, the first gate electrode, the second gate electrode, and the third gate electrode are commonly coupled to the gate line. Optionally, the stacked organic light emitting apparatus further includes a second insulating layer between the fourth electrode layer and the fifth electrode layer and insulating the fourth electrode layer from the fifth electrode layer. Optionally, the first data line and the second data line are insulated from the third drain electrode and a signal line connecting the third drain electrode and the anode of the third organic light emitting diode (e.g., the fifth electrode layer). Optionally, a portion of the second insulating layer is between the first data line and the third drain electrode and between the second data line and the third drain electrode, thereby insulating the first data line and the second data line from the third drain electrode and the signal line connecting the third drain electrode and the anode of the third organic light emitting diode (e.g., the fifth electrode layer). Optionally, a portion of the second insulating layer is between the first data line and a signal line connecting the third drain electrode and the anode of the third organic light emitting diode (e.g., the fifth electrode layer), and between the second data line and the signal line connecting the third drain electrode and the anode of the third organic light emitting diode (e.g., the fifth electrode layer), thereby insulating the first data line and the second data line from the third drain electrode and the signal line connecting the third drain electrode and the anode of the third organic light emitting diode (e.g., the fifth electrode layer).

In some embodiments, the stacked organic light emitting apparatus further includes a third insulating layer insulating the first data line from the second drain electrode and the signal line connecting the second drain electrode and the anode of the second organic light emitting diode (e.g., the third electrode layer), and a fourth insulating layer insulating the first data line and the second data line from the third drain electrode and the signal line connecting the third drain electrode and the anode of the third organic light emitting diode (e.g., the fifth electrode layer). Optionally, the third insulating layer is between the first data line and the second drain electrode thereby insulating the first data line from the second drain electrode and the signal line connecting the second drain electrode and the anode of the second organic light emitting diode (e.g., the third electrode layer). Optionally, the third insulating layer is between the first data line and a signal line connecting the second drain electrode and the anode of the second organic light emitting diode (e.g., the third electrode layer) thereby insulating the first data line from the second drain electrode and the signal line connecting the second drain electrode and the anode of the second organic light emitting diode (e.g., the third electrode layer). Optionally, the fourth insulating layer is between the first data line and the third drain electrode and between the second data line and the third drain electrode, thereby insulating the first data line and the second data line from the third drain electrode and the signal line connecting the third drain electrode and the anode of the third organic light emitting diode (e.g., the fifth electrode layer). Optionally, the fourth insulating layer is between the first data line and a signal line connecting the third drain electrode and the anode of the third organic light emitting diode (e.g., the fifth electrode layer), and between the second data line and the signal line connecting the third drain electrode and the anode of the third organic light emitting diode (e.g., the fifth electrode layer), thereby insulating the first data line and the second data line from the third drain electrode and the signal line connecting the third drain electrode and the anode of the third organic light emitting diode (e.g., the fifth electrode layer).

FIG. 1 is a schematic diagram illustrating the structure of a stacked organic light emitting apparatus. Referring to FIG. 1, the stacked organic light emitting apparatus in some embodiments includes a base substrate 0, a first organic light emitting diode 1, a second organic light emitting diode 2, and a third organic light emitting diode 3. The first organic light emitting diode 1, the second organic light emitting diode 2, and the third organic light emitting diode 3 vertically stacked together. The first organic light emitting diode 1 includes a first electrode layer 100 on the base substrate 0; a first light emitting layer 10 of a first color on a side of the first electrode layer 100 distal to the base substrate 0; and a second electrode layer 200 on a side of the first light emitting layer 10 distal to the first electrode layer 100. The second organic light emitting diode 2 includes a third electrode layer 300 on a side of the second electrode layer 200 distal to the first light emitting layer 10; a second light emitting layer 20 of a second color on a side of the third electrode layer 300 distal to the second electrode layer 200; and a fourth electrode layer 400 on a side of the second light emitting layer 20 distal to the third electrode layer 300. The third organic light emitting diode 3 includes a fifth electrode layer 500 on a side of the fourth electrode layer 400 distal to the second light emitting layer 20; a third light emitting layer 30 of a third color on a side of the fifth electrode layer 500 distal to the fourth electrode layer 400; and a sixth electrode layer 600 on a side of the third light emitting layer 30 distal to the fifth electrode layer 500.

In some embodiments, the first organic light emitting diode 1, the second organic light emitting diode 2, and the third organic light emitting diode 3 are insulated from each other. Optionally, the stacked organic light emitting apparatus further includes a first insulating layer 1000 that insulates the first organic light emitting diode 1 from the second organic light emitting diode 2, and a second insulating layer 2000 that insulates the second organic light emitting diode 2 from the third organic light emitting diode 3. Optionally, the first insulating layer 1000 is between the second electrode layer 200 and the third electrode layer 300 and insulates the second electrode layer 200 from the third electrode layer 300. Optionally, the second insulating layer 2000 is between the fourth electrode layer 400 and the fifth electrode layer 500 and insulates the fourth electrode layer 400 from the fifth electrode layer 500.

In the first organic light emitting diode 1, one of the first electrode layer 100 and the second electrode layer 200 is a cathode of the first organic light emitting diode 1, another one of the first electrode layer 100 and the second electrode layer 200 is an anode of the first organic light emitting diode 1. Optionally, the first electrode layer 100 is the anode of the first organic light emitting diode 1, the second electrode layer 200 is the cathode of the first organic light emitting diode 1. Optionally, the first electrode layer 100 is the cathode of the first organic light emitting diode 1, the second electrode layer 200 is the anode of the first organic light emitting diode 1.

In the second organic light emitting diode 2, one of the third electrode layer 300 and the fourth electrode layer 400 is a cathode of the second organic light emitting diode 2, another one of the third electrode layer 300 and the fourth electrode layer 400 is an anode of the second organic light emitting diode 2. Optionally, the third electrode layer 300 is the anode of the second organic light emitting diode 2, the fourth electrode layer 400 is the cathode of the second organic light emitting diode 2. Optionally, the third electrode layer 300 is the cathode of the second organic light emitting diode 2, the fourth electrode layer 400 is the anode of the second organic light emitting diode 2.

In the third organic light emitting diode 3, one of the fifth electrode layer 500 and the sixth electrode layer 600 is a cathode of the third organic light emitting diode 3, another one of the fifth electrode layer 500 and the sixth electrode layer 600 is an anode of the third organic light emitting diode 3. Optionally, the fifth electrode layer 500 is the anode of the third organic light emitting diode 3, the sixth electrode layer 600 is the cathode of the third organic light emitting diode 3. Optionally, the fifth electrode layer 500 is the cathode of the third organic light emitting diode 3, the sixth electrode layer 600 is the anode of the third organic light emitting diode 3.

Optionally, the cathode of the first organic light emitting diode, the cathode of the second organic light emitting diode, and the cathode of the third organic light emitting diode are electrically connected to ground. Optionally, the cathode of the first organic light emitting diode, the cathode of the second organic light emitting diode, and the cathode of the third organic light emitting diode are commonly electrically connected together. Optionally, the cathode of the first organic light emitting diode, the cathode of the second organic light emitting diode, and the cathode of the third organic light emitting diode are commonly electrically connected to ground.

Optionally, the first electrode layer 100 is the anode of the first organic light emitting diode 1, the third electrode layer 300 is the anode of the second organic light emitting diode 2, and the fifth electrode layer 500 is the anode of the third organic light emitting diode 3. Optionally, the second electrode layer 200 is the anode of the first organic light emitting diode 1, the fourth electrode layer 400 is the anode of the second organic light emitting diode 2, and the sixth electrode layer 600 is the anode of the third organic light emitting diode 3.

Optionally, the second electrode layer 200 is the cathode of the first organic light emitting diode 1, the fourth electrode layer 400 is the cathode of the second organic light emitting diode 2, and the sixth electrode layer 600 is the cathode of the third organic light emitting diode 3. Optionally, the second electrode layer 200, the fourth electrode layer 400, and the sixth electrode layer 600 are connected to ground. Optionally, the second electrode layer 200, the fourth electrode layer 400, and the sixth electrode layer 600 are commonly electrically connected. Optionally, the first electrode layer 100 is the cathode of the first organic light emitting diode 1, the third electrode layer 300 is the cathode of the second organic light emitting diode 2, and the fifth electrode layer 500 is the cathode of the third organic light emitting diode 3. Optionally, the first electrode layer 100, the third electrode layer 300, the fifth electrode layer 500 are connected to ground. Optionally, the first electrode layer 100, the third electrode layer 300, the fifth electrode layer 500 are commonly electrically connected.

Various other appropriate arrangements may be implemented. For example, in some embodiments, the first electrode layer 100 is the anode of the first organic light emitting diode 1, the fourth electrode layer 400 is the anode of the second organic light emitting diode 2, the fifth electrode layer 500 is the anode of the third organic light emitting diode 3, the second electrode layer 200 is the cathode of the first organic light emitting diode 1, the third electrode layer 300 is the cathode of the second organic light emitting diode 2, and the sixth electrode layer 600 is the cathode of the third organic light emitting diode 3. Optionally, the second electrode layer 200, the third electrode layer 300, and the sixth electrode layer 600 are commonly electrically connected to ground. In some embodiments, the first electrode layer 100 is the cathode of the first organic light emitting diode 1, the fourth electrode layer 400 is the cathode of the second organic light emitting diode 2, the fifth electrode layer 500 is the cathode of the third organic light emitting diode 3, the second electrode layer 200 is the anode of the first organic light emitting diode 1, the third electrode layer 300 is the anode of the second organic light emitting diode 2, and the sixth electrode layer 600 is the anode of the third organic light emitting diode 3. Optionally, the first electrode layer 100, the fourth electrode layer 400, the fifth electrode layer 500 are commonly electrically connected to ground.

In some embodiments, the stacked organic light emitting apparatus includes additional one or more organic light emitting diodes vertically stacked with the first organic light emitting diode 1, the second organic light emitting diode 2, and the third organic light emitting diode 3.

In some embodiments, the first color, the second color, and the third color are three primary colors. Optionally, the first color, the second color, and the third color are three different colors selected from the group consisting of red, green, and blue. Optionally, first color, the second color, and the third color are three different colors selected from the group consisting of magenta, cyan, and yellow. Optionally, the first color is red, the second color is green, and the third color is blue.

In some embodiments, the first light emitting layer 10, the second light emitting layer 20, the third light emitting layer 30 are three different light emitting layers selected from the group consisting of a red light emitting layer, a green light emitting layer, and a blue light emitting layer. Optionally, the first light emitting layer 10 is a red light emitting layer, the second light emitting layer 20 is a green light emitting layer, and the third light emitting layer 30 is a blue light emitting layer.

One or more electrode layers and one or more insulating layers of the stacked organic light emitting apparatus may be transparent. Optionally, all electrode layers and all insulating layers of the stacked organic light emitting apparatus are transparent. For example, in a dual-emission type stacked organic light emitting apparatus, the first electrode layer 100, the second electrode layer 200, the third electrode layer 300, the fourth electrode layer 400, the fifth electrode layer 500, and the sixth electrode layer 600 are transparent electrode layers; and the first insulating layer 1000 and the second insulating layer 2000 are transparent insulating layers.

In some embodiments, the stacked organic light emitting apparatus is a top-emission type stacked organic light emitting apparatus. Optionally, the second electrode layer 200, the third electrode layer 300, the fourth electrode layer 400, the fifth electrode layer 500, and the sixth electrode layer 600 are transparent electrode layers; and the first insulating layer 1000 and the second insulating layer 2000 are transparent insulating layers.

In some embodiments, the stacked organic light emitting apparatus is a bottom-emission type stacked organic light emitting apparatus. Optionally, first electrode layer 100, the second electrode layer 200, the third electrode layer 300, the fourth electrode layer 400, and the fifth electrode layer 500 are transparent electrode layers; and the first insulating layer 1000 and the second insulating layer 2000 are transparent insulating layers.

In some embodiments, the first light emitting layer 10, the second light emitting layer 20, and the third light emitting layer 30 are three different light emitting layers selected from the group consisting of a red light emitting layer, a green light emitting layer, and a blue light emitting layer. Optionally, an emission spectrum of a blue light emitting material of the blue light emitting layer minimally overlaps with or does not overlap with absorption spectrums of a green light emitting material of the green light emitting layer and a red light emitting material of the red light emitting layer; and an emission spectrum of the green light emitting material of the green light emitting layer minimally overlaps with or does not overlap with an absorption spectrum of a red light emitting material of the red light emitting layer. In some embodiments, the first light emitting layer 10 is a red light emitting layer, the second light emitting layer 20 is a green light emitting layer, and the third light emitting layer 30 is a blue light emitting layer; and an emission spectrum of the third light emitting layer 30 minimally overlaps with or does not overlap with absorption spectrums of the second light emitting layer 20 and the first light emitting layer 10, and an emission spectrum of the second light emitting layer 20 minimally overlaps with or does not overlap with an absorption spectrum of the first light emitting layer 10. The light emitted from the blue light emitting layer has the highest energy level. By selecting the green light emitting material and the red light emitting material to have absorption spectrums non-overlapping or only minimally overlapping with the emission spectrum of the blue light emitting material, the light emitted from the blue light emitting layer would not excite, or only minimally excite if any, the green light emitting material and the red light emitting material. By selecting the red light emitting material to have an absorption spectrum non-overlapping or only minimally overlapping with the emission spectrum of the green light emitting material, the light emitted from the green light emitting layer would not excite, or only minimally excite if any, the red light emitting material. By having this design, color purity of the light emitted from the present stacked organic light emitting apparatus can be optimized.

In some embodiments, the blue light emitting layer is on a side of the green light emitting layer and the red light emitting layer proximal to a light emitting side of the stacked organic light emitting apparatus, achieving an enhanced light emission efficiency. Typically, the blue light emitting material has a relatively low light emission efficiency, by placing the blue light emitting layer most proximal to the light emitting side, absorption of blue light by other light emitting layers can be avoided, thereby enhancing the light emission efficiency of the stacked organic light emitting apparatus.

Figure 2:
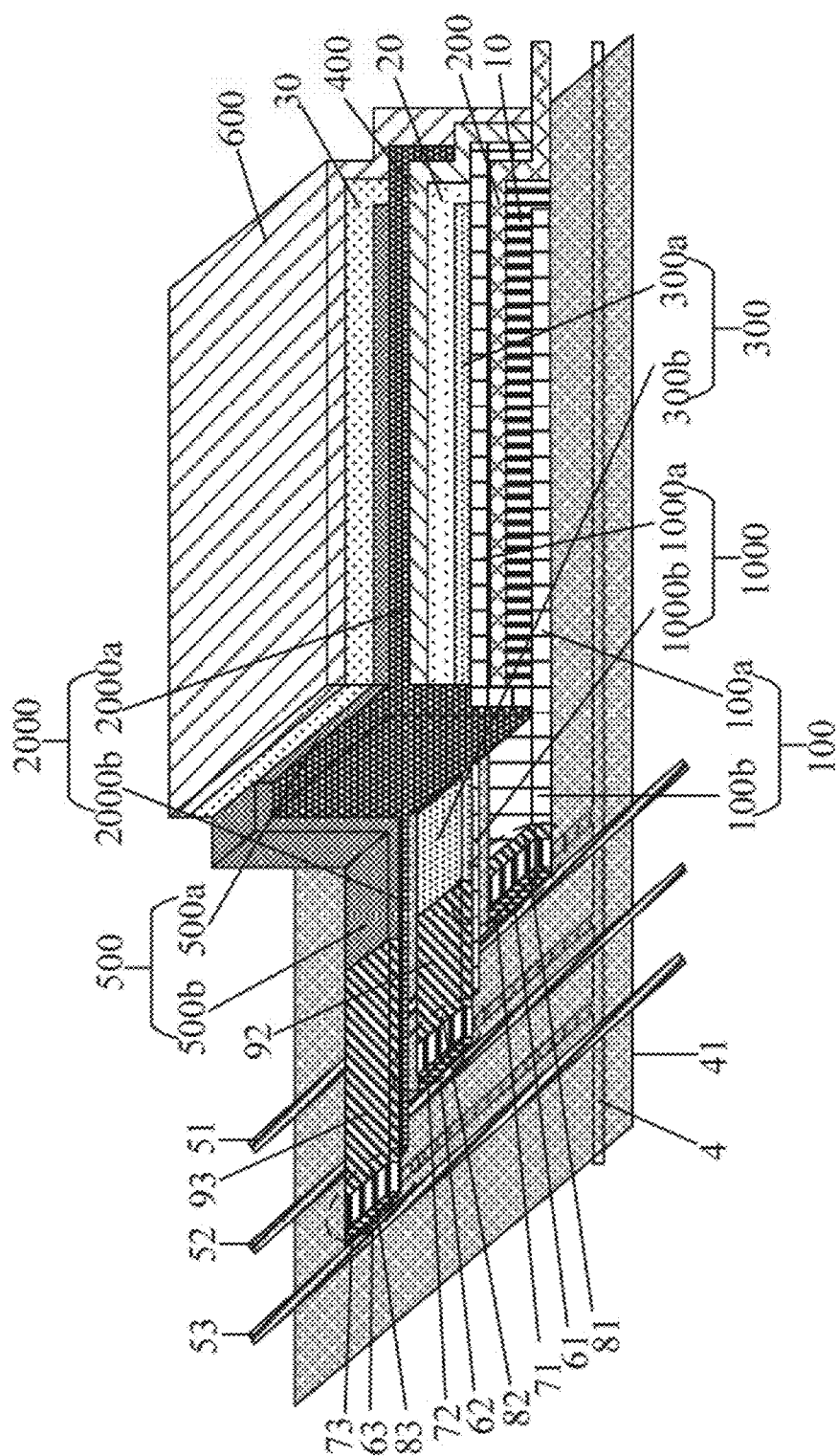
FIG. 2 is a schematic diagram illustrating the structure of a stacked organic light emitting apparatus in some embodiments according to the present disclosure.
Figure 3:
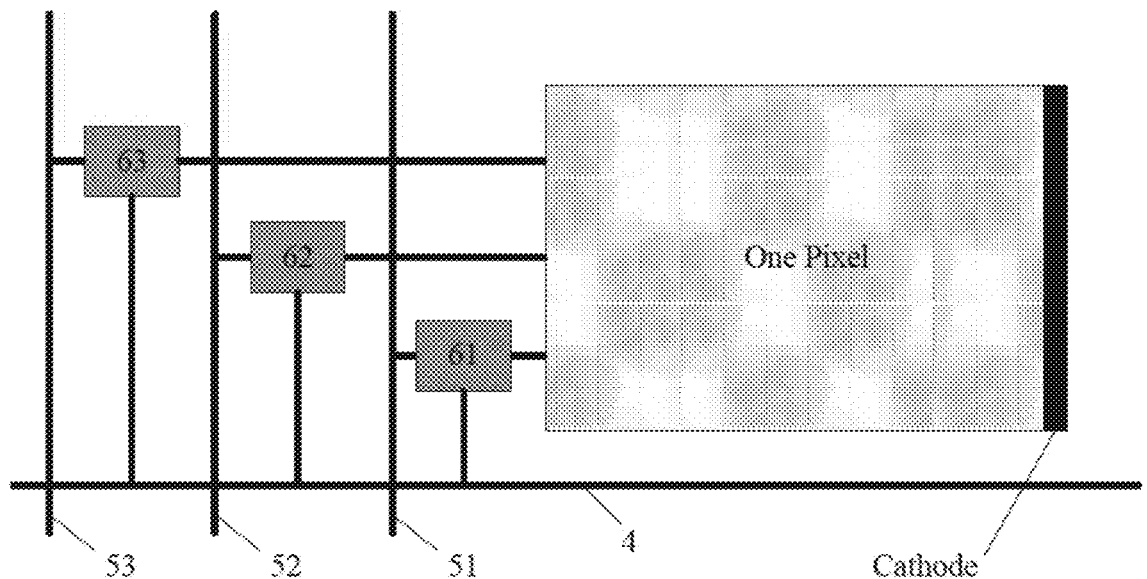
FIG. 3 is a plan view of the stacked organic light emitting apparatus as shown in FIG. 2.
Figure 4:
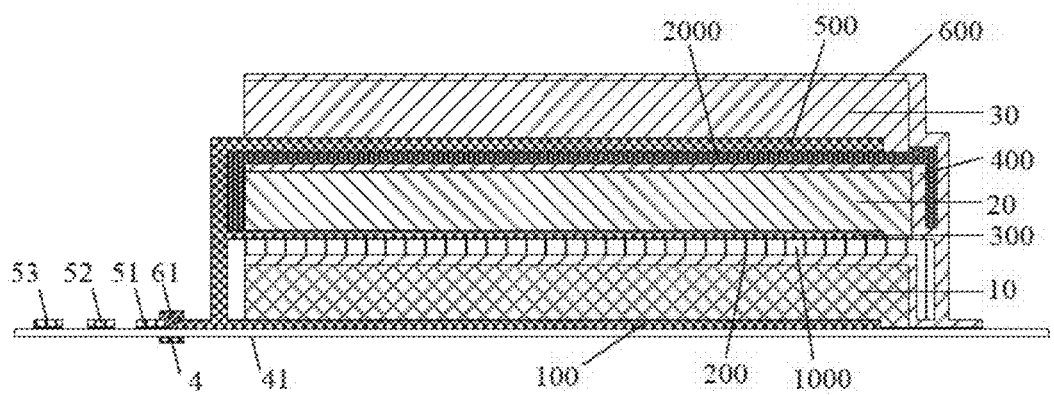
FIG. 4 is a cross-sectional view of the stacked organic light emitting apparatus as shown in FIG. 2.

FIG. 2 is a schematic diagram illustrating the structure of a stacked organic light emitting apparatus in some embodiments according to the present disclosure. FIG. 3 is a plan view of the stacked organic light emitting apparatus as shown in FIG. 2. FIG. 4 is a cross-sectional view of the stacked organic light emitting apparatus as shown in FIG. 2. Referring to FIG. 2, the stacked organic light emitting apparatus in some embodiments further includes a gate line 4; a first data line 51; a second data line 52; a third data line 53; a first switching thin film transistor 61 for controlling the first organic light emitting diode 1; a second switching thin film transistor 62 for controlling the second organic light emitting diode 2; and a third switching thin film transistor 63 for controlling the third organic light emitting diode 3. The first switching thin film transistor 61 includes a first gate electrode, a first source electrode 71 coupled to the first data line 51, and a first drain electrode 81 coupled to the anode of the first organic light emitting diode 1. The second switching thin film transistor 62 includes a second gate electrode, a second source electrode 72 coupled to the second data line 52, and a second drain electrode 82 coupled to the anode of the second organic light emitting diode 2. The third switching thin film transistor 63 includes a third gate electrode, a third source electrode 73 coupled to the third data line 53, and a third drain electrode 83 coupled to the anode of the third organic light emitting diode 3. The first gate electrode, the second gate electrode, and the third gate electrode are commonly coupled to the gate line 4. Optionally, the stacked organic light emitting apparatus further includes a gate insulating layer 41 between the gate line 4 and the active layers of the first switching thin film transistor 61, the second switching thin film transistor 62, and the third switching thin film transistor 63.

Referring to FIG. 2, in some embodiments, the first insulating layer 1000 not only insulates the second electrode layer 200 from the third electrode layer 300, but also extends over to a position between the first data line 51 and the second drain electrode 82, and insulates the first data line 51 from the second drain electrode 82. Similarly, as shown in FIG. 2, in some embodiments, the second insulating layer 2000 not only insulates the fourth electrode layer 400 from the fifth electrode layer 500, but also extends over to a position between the first data line 51 and the third drain electrode 83 and between the second data line 52 and the third drain electrode 83, and insulates the first data line 51 and the second data line 52 from the third drain electrode 83.

Figure 5A:
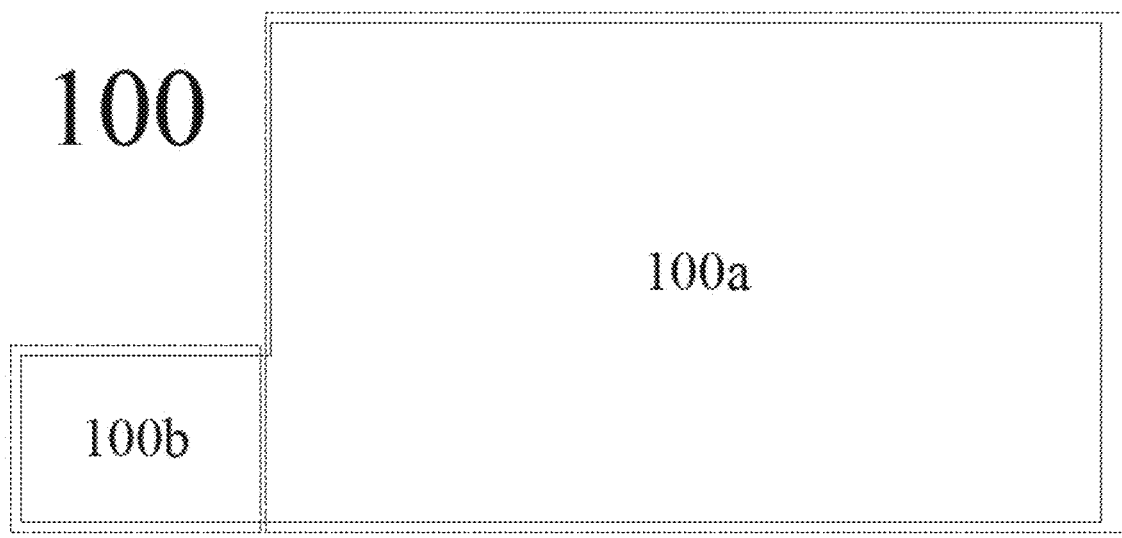
FIG. 5A is a plan view of the first electrode layer of the stacked organic light emitting apparatus as shown in FIG. 2.
Figure 5B:
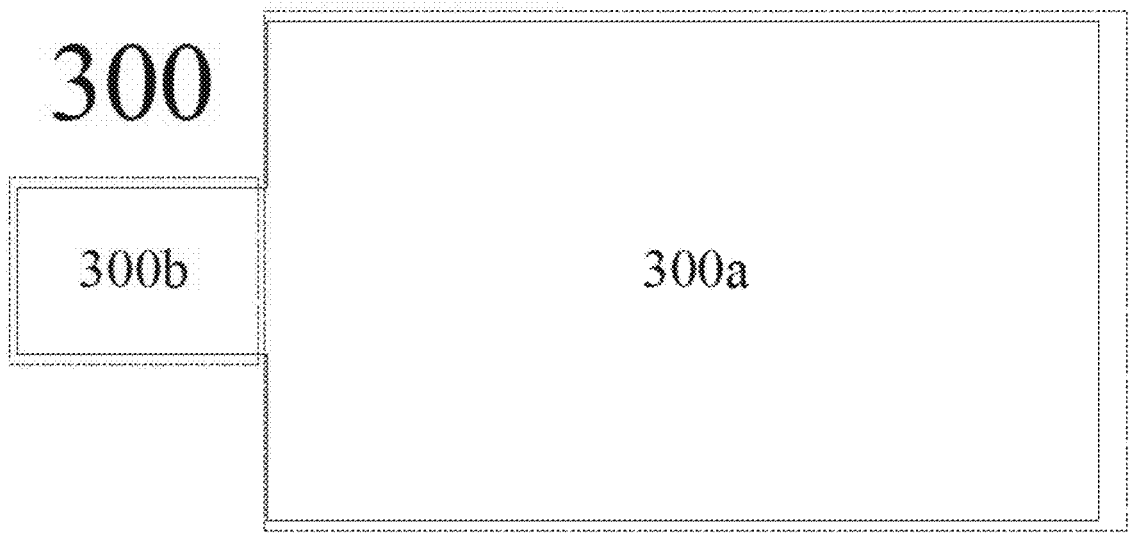
FIG. 5B is a plan view of the third electrode layer of the stacked organic light emitting apparatus as shown in FIG. 2.
Figure 5C:
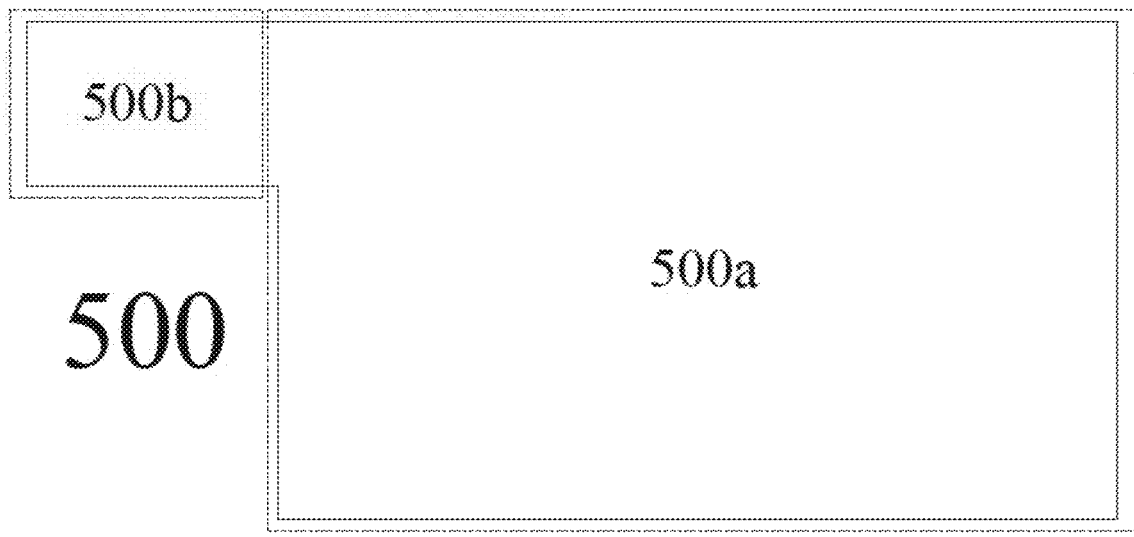
FIG. 5C is a plan view of the fifth electrode layer of the stacked organic light emitting apparatus as shown in FIG. 2.

FIGS. 5A to 5C are plan views of the first electrode layer, the third electrode layer, and the fifth electrode layer of the stacked organic light emitting apparatus as shown in FIG. 2. Referring to FIG. 2 and FIG. 5A, the first electrode layer 100 includes at least a first electrode portion 100a and a second electrode portion 100b. The first electrode portion 100a is between the gate insulating layer 41 and the first light emitting layer 10. The second electrode portion 100b is a portion in contact with and connected to the first drain electrode 81 of the first switching thin film transistor 61. Referring to FIG. 2 and FIG. 5B, the third electrode layer 300 includes at least a third electrode portion 300a and a fourth electrode portion 300b. The third electrode portion 300a is between the first insulating layer 1000 and the second light emitting layer 20. The fourth electrode portion 300b is a portion in contact with and connected to the second drain electrode 82 of the second switching thin film transistor 62. Referring to FIG. 2 and FIG. 5C, the fifth electrode layer 500 includes at least a fifth electrode portion 500a and a sixth electrode portion 500b. The fifth electrode portion 500a is between the second insulating layer 2000 and the third light emitting layer 30. The sixth electrode portion 500b is a portion in contact with and connected to the third drain electrode 83 of the third switching thin film transistor 63.

Figure 6A:
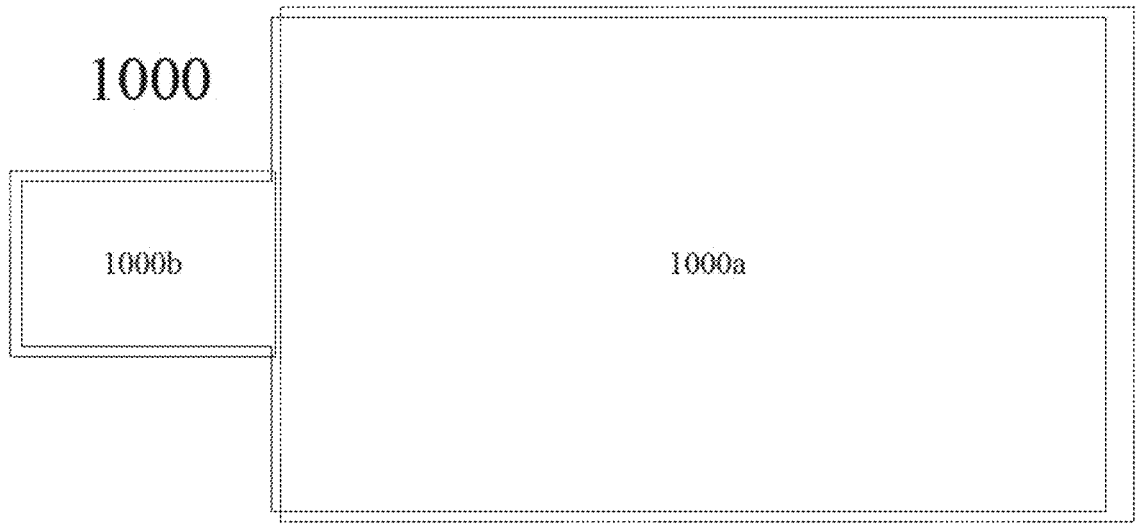
FIG. 6A is a plan view of the first insulating layer of the stacked organic light emitting apparatus as shown in FIG. 2.
Figure 6B:
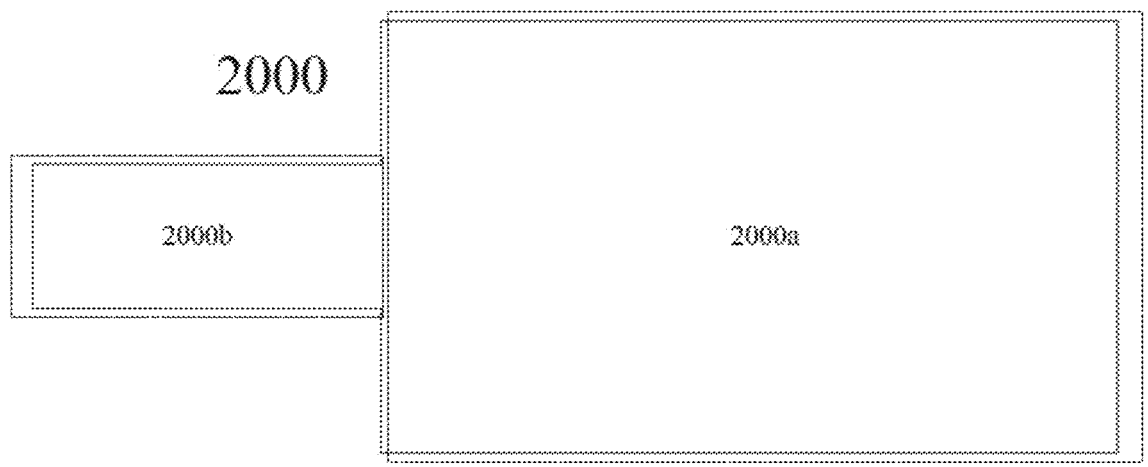
FIG. 6B is a plan view of the second insulating layer of the stacked organic light emitting apparatus as shown in FIG. 2.

FIGS. 6A to 6B are plan views of the first insulating layer and the second insulating layer of the stacked organic light emitting apparatus as shown in FIG. 2. Referring to FIG. 2 and FIG. 6A, the first insulating layer 1000 includes at least a first insulating portion 1000a and a second insulating portion 1000b. The first insulating portion 1000a is between the second electrode layer 200 and the third electrode layer 300 (specifically the third electrode portion 300a). The second insulating portion 1000b is between the first data line 51 and the second drain electrode 82, and insulates the first data line 51 from the second drain electrode 82. Referring to FIG. 2 and FIG. 6B, the second insulating layer 2000 includes at least a third insulating portion 2000a and a fourth insulating portion 2000b. The third insulating portion 2000a is between the fourth electrode layer 400 and the fifth electrode layer 500 (specifically the fifth electrode portion 500a). The fourth insulating portion 2000b is between the first data line 51 and the third drain electrode 83 and between the second data line 52 and the third drain electrode 83, and insulates the first data line 51 and the second data line 52 from the third drain electrode 83.

In some embodiments, the first data line 51 is insulated from the second drain electrode 82 and a signal line 92 connecting the second drain electrode 82 and the third electrode layer 300 by an insulating layer different from the first insulating layer 1000. For example, the first data line 51 and the second drain electrode 82 are not insulated by the second insulating portion 1000b, and the first insulating layer 1000 need not extend over to a position between the first data line 51 and the second drain electrode 82. Accordingly, in some embodiment, the stacked organic light emitting apparatus further includes a third insulating layer between the first data line 51 and the second drain electrode 82, and insulates the first data line 51 from the second drain electrode 82.

In some embodiments, the first data line 51 and the second data line 52 are insulated from the third drain electrode 83 and a signal line 93 connecting the third drain electrode 83 and the fifth electrode layer 500 by an insulating layer different from the second insulating layer 2000. For example, the first data line 51 and the second data line 52 are not insulated from the third drain electrode 83 by the fourth insulating portion 2000b, and the second insulating layer 2000 need not extend over to a position between the first data line 51 and the third drain electrode 83 and between the second data line 52 and the third drain electrode 83. Accordingly, in some embodiment, the stacked organic light emitting apparatus further includes a fourth insulating layer between the third drain electrode 83 and the second data line 52, and between the third drain electrode 83 and the first data line 51.

Optionally, the first data line 51 and the second data line 52 are insulated from the third dram electrode 83 and a signal line 93 connecting the third drain electrode 83 and the fifth electrode layer 500 by two separate insulating layers. Accordingly, in some embodiment, the stacked organic light emitting apparatus includes a fifth insulating layer between the third drain electrode 83 and the first data line 51, and a sixth insulating layer between the third drain electrode 83 and the second data line 52.

In some embodiments, the first organic light emitting diode further includes one or more of the following layers: a first hole injection layer, a first hole transport layer, a first electron injection layer, and a first electron transport layer. Optionally, the first electrode layer is an anode, and the second electrode layer is a cathode, and the first organic light emitting diode includes a first electrode layer on the base substrate; a first hole injection layer on a side of the first electrode layer distal to the base substrate; a first hole transport layer on side of the first hole injection layer distal to the first electrode layer; a first light emitting layer of a first color on a side of the first hole transport layer distal to the first hole injection layer; a first electron transport layer on a side of the first light emitting layer distal to the first hole transport layer; a first electron injection layer on a side of the first electron transport layer distal to the first light emitting layer; and a second electrode layer on a side of the first electron injection layer distal to the first electron transport layer. Optionally, the first electrode layer is a cathode, and the second electrode layer is an anode, and the first organic light emitting diode includes a first electrode layer on the base substrate; a first electron injection layer on a side of the first electrode layer distal to the base substrate; a first electron transport layer on side of the first electron injection layer distal to the first electrode layer; a first light emitting layer of a first color on a side of the first electron transport layer distal to the first electron injection layer; a first hole transport layer on a side of the first light emitting layer distal to the first electron transport layer; a first hole injection layer on a side of the first hole transport layer distal to the first light emitting layer; and a second electrode layer on a side of the first hole injection layer distal to the first hole transport layer.

In some embodiments, the second organic light emitting diode further includes one or more of the following layers; a second hole injection layer, a second hole transport layer, a second electron injection layer, and a second electron transport layer. Optionally, the third electrode layer is an anode, and the fourth electrode layer is a cathode, and the second organic light emitting diode includes a third electrode layer on a side of the second electrode layer distal to the first light emitting layer; a second hole injection layer on a side of the third electrode layer distal to the second electrode layer; a second hole transport layer on side of the second hole injection layer distal to the third electrode layer; a second light emitting layer of a second color on a side of the second hole transport layer distal to the second hole injection layer; a second electron transport layer on a side of the second light emitting layer distal to the second hole transport layer; a second electron injection layer on a side of the second electron transport layer distal to the second light emitting layer; and a fourth electrode layer on a side of the second electron injection layer distal to the second electron transport layer. Optionally, the third electrode layer is a cathode, and the fourth electrode layer is an anode, and the second organic light emitting diode includes a third electrode layer on a side of the second electrode layer distal to the first light emitting layer; a second electron injection layer on a side of the third electrode layer distal to the second electrode layer; a second electron transport layer on side of the second electron injection layer distal to the third electrode layer; a second light emitting layer of a second color on a side of the second electron transport layer distal to the second electron injection layer; a second hole transport layer on a side of the second light emitting layer distal to the second electron transport layer; a second hole injection layer on a side of the second hole transport layer distal to the second light emitting layer; and a fourth electrode layer on a side of the second hole injection layer distal to the second hole transport layer.

In some embodiments, the third organic light emitting diode further includes one or more of the following layers: a third hole injection layer, a third hole transport layer, a third electron injection layer, and a third electron transport layer. Optionally, the fifth electrode layer is an anode, and the sixth electrode layer is a cathode, and the third organic light emitting diode includes a fifth electrode layer on a side of the fourth electrode layer distal to the second light emitting layer; a third hole injection layer on a side of the fifth electrode layer distal to the fourth electrode layer; a third hole transport layer on side of the third hole injection layer distal to the fifth electrode layer; a third light emitting layer of a third color on a side of the third hole transport layer distal to the third hole injection layer; a third electron transport layer on a side of the third light emitting layer distal to the third hole transport layer; a third electron injection layer on a side of the third electron transport layer distal to the third light emitting layer; and a sixth electrode layer on a side of the third electron injection layer distal to the third electron transport layer. Optionally, the fifth electrode layer is a cathode, and the sixth electrode layer is an anode, and the third organic light emitting diode includes a fifth electrode layer on a side of the fourth electrode layer distal to the second light emitting layer; a third electron injection layer on a side of the fifth electrode layer distal to the fourth electrode layer; a third electron transport layer on side of the third electron injection layer distal to the fifth electrode layer; a third light emitting layer of a third color on a side of the third electron transport layer distal to the third electron injection layer; a third hole transport layer on a side of the third light emitting layer distal to the third electron transport layer, a third hole injection layer on a side of the third hole transport layer distal to the third light emitting layer; and a sixth electrode layer on a side of the third hole injection layer distal to the third hole transport layer.

In another aspect, the present disclosure provides an organic light emitting diode array substrate having a stacked organic light emitting apparatus described herein. In another aspect, the present disclosure provides an organic light emitting diode display panel having a plurality of pixels, each of the plurality of pixels includes the stacked organic light emitting apparatus described herein. In another aspect, the present disclosure provides an organic light emitting diode display apparatus having the organic light emitting diode display panel described herein. Examples of appropriate display apparatuses include, but are not limited to, an electronic paper, a mobile phone, a tablet computer, a television, a monitor, a notebook computer, a digital album, a GPS, etc.

In the present array substrate, display panel, and display apparatus, at least three organic light emitting diodes are vertically stacked together. The pixel size is significantly reduced because the light emitting area is shared by all three organic light emitting diodes. As a result, the resolution of the image display can be improved by a factor of three.

In another aspect, the present disclosure provides a method of fabricating a stacked organic light emitting apparatus. In some embodiments, the method includes forming a first organic light emitting diode, a second organic light emitting diode, and a third organic light emitting diode vertically stacked. Optionally, the method includes forming a first organic light emitting diode on a base substrate, forming a first insulating layer on a side of the first organic light emitting diode distal to the base substrate; and forming a second organic light emitting diode on a side of the first insulating layer distal to the first organic light emitting diode. Optionally, the method further includes forming a second insulating layer on a side of the second organic light emitting diode distal to the first insulating layer; and forming a third organic light emitting diode on a side of the second insulating layer distal to the second organic light emitting diode.

Optionally, the step of forming the first organic light emitting diode includes forming a first electrode layer on a base substrate; forming a first light emitting layer of a first color on a side of the first electrode layer distal to the base substrate; and forming a second electrode layer on a side of the first light emitting layer distal to the first electrode layer.

Optionally, the step of forming the second organic light emitting diode includes forming a third electrode layer on a side of the first insulating layer distal to the second electrode layer; forming a second light emitting layer of a second color on a side of the third electrode layer distal to the first insulating layer; and forming a fourth electrode layer on a side of the second light emitting layer distal to the third electrode layer.

Optionally, the step of forming the third organic light emitting diode includes forming a fifth electrode layer on a side of the second insulating layer distal to the fourth electrode layer; forming a third light emitting layer of a third color on a side of the fifth electrode layer distal to the second insulating layer; and forming a sixth electrode layer on a side of the third light emitting layer distal to the fifth electrode layer.

In some embodiments, the method of fabricating the stacked organic light emitting apparatus includes forming a first electrode layer on a base substrate; forming a first light emitting layer of a first color on a side of the first electrode layer distal to the base substrate; forming a second electrode layer on a side of the first light emitting layer distal to the first electrode layer; forming a first insulating layer on a side of the second electrode layer distal to the first light emitting layer, forming a third electrode layer on a side of the first insulating layer distal to the second electrode layer; forming a second light emitting layer of a second color on a side of the third electrode layer distal to the first insulating layer; forming a fourth electrode layer on a side of the second light emitting layer distal to the third electrode layer; forming a second insulating layer on a side of the fourth electrode layer distal to the second light emitting layer; forming a fifth electrode layer on a side of the second insulating layer distal to the fourth electrode layer; forming a third light emitting layer of a third color on a side of the fifth electrode layer distal to the second insulating layer; and forming a sixth electrode layer on a side of the third light emitting layer distal to the fifth electrode layer. The first insulating layer is formed to insulate the second electrode layer from the third electrode layer. The second insulating layer is formed to insulate the fourth electrode layer from the fifth electrode layer.

In the first organic light emitting diode formed according to the present method, one of the first electrode layer and the second electrode layer is a cathode of the first organic light emitting diode, another one of the first electrode layer and the second electrode layer is an anode of the first organic light emitting diode. Optionally, the first electrode layer is the anode of the first organic light emitting diode, the second electrode layer is the cathode of the first organic light emitting diode. Optionally, the first electrode layer is the cathode of the first organic light emitting diode, the second electrode layer is the anode of the first organic light emitting diode.

In the second organic light emitting diode formed according to the present method, one of the third electrode layer and the fourth electrode layer is a cathode of the second organic light emitting diode, another one of the third electrode layer and the fourth electrode layer is an anode of the second organic light emitting diode. Optionally, the third electrode layer is the anode of the second organic light emitting diode, the fourth electrode layer is the cathode of the second organic light emitting diode. Optionally, the third electrode layer is the cathode of the second organic light emitting diode, the fourth electrode layer is the anode of the second organic light emitting diode.

In the third organic light emitting diode formed according to the present method, one of the fifth electrode layer and the sixth electrode layer is a cathode of the third organic light emitting diode, another one of the fifth electrode layer and the sixth electrode layer is an anode of the third organic light emitting diode. Optionally, the fifth electrode layer is the anode of the third organic light emitting diode, the sixth electrode layer is the cathode of the third organic light emitting diode. Optionally, the fifth electrode layer is the cathode of the third organic light emitting diode, the sixth electrode layer is the anode of the third organic light emitting diode.

Optionally, the cathode of the first organic light emitting diode, the cathode of the second organic light emitting diode, and the cathode of the third organic light emitting diode are formed to be electrically connected to ground. Optionally, the cathode of the first organic light emitting diode, the cathode of the second organic light emitting diode, and the cathode of the third organic light emitting diode are formed to be commonly electrically connected together. Optionally, the cathode of the first organic light emitting diode, the cathode of the second organic light emitting diode, and the cathode of the third organic light emitting diode are formed to be commonly electrically connected to ground.

Optionally, the first electrode layer is the anode of the first organic light emitting diode, the third electrode layer is the anode of the second organic light emitting diode, and the fifth electrode layer is the anode of the third organic light emitting diode. Optionally, the second electrode layer is the anode of the first organic light emitting diode, the fourth electrode layer is the anode of the second organic light emitting diode, and the sixth electrode layer is the anode of the third organic light emitting diode.

Optionally, the second electrode layer is the cathode of the first organic light emitting diode, the fourth electrode layer is the cathode of the second organic light emitting diode, and the sixth electrode layer is the cathode of the third organic light emitting diode. Optionally, the second electrode layer, the fourth electrode layer, and the sixth electrode layer are formed to be connected to ground. Optionally, the second electrode layer, the fourth electrode layer, and the sixth electrode layer are formed to be commonly electrically connected. Optionally, the first electrode layer is the cathode of the first organic light emitting diode, the third electrode layer is the cathode of the second organic light emitting diode, and the fifth electrode layer is the cathode of the third organic light emitting diode. Optionally, the first electrode layer, the third electrode layer, the fifth electrode layer are formed to be connected to ground. Optionally, the first electrode layer, the third electrode layer, the fifth electrode layer are formed to be commonly electrically connected.

In some embodiments, the first color, the second color, and the third color are three primary colors. Optionally, the first color, the second color, and the third color are three different colors selected from the group consisting of red, green, and blue. Optionally, first color, the second color, and the third color are three different colors selected from the group consisting of magenta, cyan, and yellow. Optionally, the first color is red, the second color is green, and the third color is blue. In some embodiments, the first light emitting layer, the second light emitting layer, the third light emitting layer are three different light emitting layers selected from the group consisting of a red light emitting layer, a green light emitting layer, and a blue light emitting layer. Optionally, the first light emitting layer is a red light emitting layer, the second light emitting layer is a green light emitting layer, and the third light emitting layer is a blue light emitting layer.

In some embodiments, one or more electrode layers and insulating layers of the stacked organic light emitting apparatus may be made of transparent materials. Optionally, all electrode layers and insulating layers of the stacked organic light emitting apparatus are made of transparent materials. For example, in a dual-emission type stacked organic light emitting apparatus, the first electrode layer, the second electrode layer, the third electrode layer, the fourth electrode layer, the fifth electrode layer, and the sixth electrode layer are made of transparent electrode materials; and the first insulating layer and the second insulating layer are made of transparent insulating materials.

In some embodiments, the stacked organic light emitting apparatus is a top-emission type stacked organic light emitting apparatus. Optionally, the second electrode layer, the third electrode layer, the fourth electrode layer, the fifth electrode layer, and the sixth electrode layer are made of transparent electrode materials; and the first insulating layer and the second insulating layer are made of transparent insulating materials.

In some embodiments, the stacked organic light emitting apparatus is a bottom-emission type stacked organic light emitting apparatus. Optionally, first electrode layer, the second electrode layer, the third electrode layer, the fourth electrode layer, and the fifth electrode layer are made of transparent electrode materials; and the first insulating layer and the second insulating layer are made of transparent insulating materials.

In some embodiments, the first light emitting layer, the second light emitting layer, and the third light emitting layer are three different light emitting layers selected from the group consisting of a red light emitting layer, a green light emitting layer, and a blue light emitting layer. Optionally, the blue light emitting layer is made of a blue light emitting material having an emission spectrum that minimally overlaps with or does not overlap with absorption spectrums of the green light emitting material of the green light emitting layer and the red light emitting material of the red light emitting layer; and the green light emitting layer is made of a green light emitting material having an emission spectrum that minimally overlaps with or does not overlap with an absorption spectrum of the red light emitting material of the red light emitting layer. In some embodiments, the first light emitting layer is a red light emitting layer, the second light emitting layer is a green light emitting layer, and the third light emitting layer is a blue light emitting layer; and the third light emitting layer is made of a light emitting material having an emission spectrum that minimally overlaps with or does not overlap with absorption spectrums of the second light emitting layer and the first light emitting layer, and the second light emitting layer is made of a light emitting material having an emission spectrum that minimally overlaps with or does not overlap with an absorption spectrum of the first light emitting layer.

In some embodiments, the method further includes forming a gate line; forming a first data line; forming a second data line; forming a third data line; forming a first switching thin film transistor for controlling the first organic light emitting diode; forming a second switching thin film transistor for controlling the second organic light emitting diode; and forming a third switching thin film transistor for controlling the third organic light emitting diode. Optionally, the step of forming a first switching thin film transistor includes forming a first gate electrode, forming a first source electrode coupled to the first data line, and forming a first drain electrode coupled to the anode of the first organic light emitting diode. Optionally, the step of forming a second switching thin film transistor includes forming a second gate electrode, forming a second source electrode coupled to the second data line, and forming a second drain electrode coupled to the anode of the second organic light emitting diode. Optionally, the step of forming a third switching thin film transistor includes forming a third gate electrode, forming a third source electrode coupled to the third data line, and forming a third drain electrode coupled to the anode of the third organic light emitting diode. Optionally, the first gate electrode, the second gate electrode, and the third gate electrode are formed to be commonly coupled to the gate line. Optionally, the method further includes forming a gate insulating layer between the gate line and the active layers of the first switching thin film transistor, the second switching thin film transistor, and the third switching thin film transistor.

In some embodiments, the first data line is formed to be insulated from the second drain electrode and a signal line connecting the second drain electrode and the anode of the second organic light emitting diode (e.g., the third electrode layer). Optionally, a portion of the first insulating layer is formed between the first data line and the second drain electrode thereby insulating the first data line from the second drain electrode and the signal line connecting the second drain electrode and the anode of the second organic light emitting diode (e.g., the third electrode layer). Optionally, a portion of the first insulating layer is formed between the first data line and a signal line connecting the second drain electrode and the anode of the second organic light emitting diode (e.g., third electrode layer) thereby insulating the first data line from the second drain electrode and the signal line connecting the second drain electrode and the anode of the second organic light emitting diode (e.g., the third electrode layer). Optionally, the method further includes forming a third insulating layer insulating the first data line from the second drain electrode and the signal line connecting the second drain electrode and the anode of the second organic light emitting diode (e.g., the third electrode layer).

In some embodiments, the first data line and the second data line are formed to be insulated from the third drain electrode and a signal line connecting the third drain electrode and the anode of the third organic light emitting diode (e.g., the fifth electrode layer). Optionally, a portion of the second insulating layer is formed between the first data line and the third drain electrode and between the second data line and the third drain electrode, thereby insulating the first data line and the second data line from the third drain electrode and the signal line connecting the third drain electrode and the anode of the third organic light emitting diode (e.g., the fifth electrode layer). Optionally, a portion of the second insulating layer is formed between the first data line and a signal line connecting the third drain electrode and the anode of the third organic light emitting diode (e.g., the fifth electrode layer), and between the second data line and the signal line connecting the third drain electrode and the anode of the third organic light emitting diode (e.g., the fifth electrode layer), thereby insulating the first data line and the second data line from the third drain electrode and the signal line connecting the third drain electrode and the anode of the third organic light emitting diode (e.g., the fifth electrode layer). Optionally, the method further includes forming a fourth insulating layer insulating the first data line and the second data line from the third drain electrode and the signal line connecting the third drain electrode and the anode of the third organic light emitting diode (e.g., the fifth electrode layer).

In some embodiments, the first insulating layer is formed to not only insulate the second electrode layer from the third electrode layer, but also extend over to a position between the first data line and the second drain electrode, and insulates the first data line from the second drain electrode. Similarly, in some embodiments, the second insulating layer is formed to not only insulate the fourth electrode layer from the fifth electrode layer, but also extend over to a position between the first data line and the third drain electrode and between the second data line and the third drain electrode, and insulates the first data line and the second data line from the third drain electrode.

In some embodiments, the step of forming the first electrode layer includes forming at least a first electrode portion and a second electrode portion. The first electrode portion is formed between the gate insulating layer and the first light emitting layer. The second electrode portion is formed to be in contact with and connected to the first drain electrode of the first switching thin film transistor. In some embodiments, the step of forming the third electrode layer includes forming at least a third electrode portion and a fourth electrode portion. The third electrode portion is formed between the first insulating layer and the second light emitting layer. The fourth electrode portion is formed to be in contact with and connected to the second drain electrode of the second switching thin film transistor. In some embodiments, the step of forming the fifth electrode layer includes forming at least a fifth electrode portion and a sixth electrode portion. The fifth electrode portion is formed between the second insulating layer and the third light emitting layer. The sixth electrode portion is formed to be in contact with and connected to the third drain electrode of the third switching thin film transistor.

In some embodiments, the step of forming the first insulating layer includes forming at least a first insulating portion and a second insulating portion. The first insulating portion is formed between the second electrode layer and the third electrode layer (specifically the third electrode portion). The second insulating portion is formed between the first data line and the second drain electrode, and insulates the first data line from the second drain electrode. In some embodiments, the step of forming the second insulating layer includes forming at least a third insulating portion and a fourth insulating portion. The third insulating portion is formed between the fourth electrode layer and the fifth electrode layer (specifically the fifth electrode portion). The fourth insulating portion is formed between the first data line and the third drain electrode and between the second data line and the third drain electrode, and insulates the first data line and the second data line from the third drain electrode.

In some embodiments, an insulating layer different from the first insulating layer is formed to insulate the first data line and the second drain electrode from each other. For example, the first data line and the second drain electrode are not insulated by the second insulating portion, and the first insulating layer need not be formed to extend over to a position between the first data line and the second drain electrode. Accordingly, in some embodiment, the method further includes forming a third insulating layer between the first data line and the second drain electrode. The third insulating layer is formed to insulate the first data line from the second drain electrode.

In some embodiments, an insulating layer different from the second insulating layer is formed to insulate the first data line and the second data line from the third drain electrode. For example, the first data line and the second data line are not insulated from the third drain electrode by the fourth insulating portion, and the second insulating layer need not be formed to extend over to a position between the first data line and the third drain electrode and between the second data line and the third drain electrode. Accordingly, in some embodiment, the method further includes forming a fourth insulating layer between the third drain electrode and the second data line, and between the third drain electrode and the first data line. The fourth insulating layer is formed to insulate the first data line from the third drain electrode, and insulate the second data line from the third drain electrode.

Optionally, two separate insulating layers are formed to respectively insulate the first data line and the second data line from the third drain electrode. Accordingly, in some embodiment, the method further includes forming a fifth insulating layer between the third drain electrode and the first data line, and forming a sixth insulating layer between the third drain electrode and the second data line. The fifth insulating layer is formed to insulate the third drain electrode from the first data line. The sixth insulating layer is formed to insulate the third drain electrode and the second data line.

In some embodiments, the step of forming the first drain electrode, the step of forming the second drain electrode, and the step of forming the third drain electrode are performed prior to the step of forming the third organic light emitting diode.

In some embodiments, the step of forming the first drain electrode is performed prior to the step of forming the first organic light emitting diode; the step of forming the second drain electrode is performed prior to the step of forming the second organic light emitting diode and subsequent to the step of forming the first organic light emitting diode; and the step of forming the third drain electrode is performed prior to the step of forming the third organic light emitting diode and subsequent to the step of forming the second organic light emitting diode.

In some embodiments, the step of forming the first organic light emitting diode further includes one or more of the following steps: forming a first hole injection layer, forming a first hole transport layer, forming a first electron injection layer, and forming a first electron transport layer. Optionally, the first electrode layer is an anode, and the second electrode layer is a cathode, and the step of forming the first organic light emitting diode includes forming a first electrode layer on the base substrate; forming a first hole injection layer on a side of the first electrode layer distal to the base substrate; forming a first hole transport layer on side of the first hole injection layer distal to the first electrode layer; forming a first light emitting layer of a first color on a side of the first hole transport layer distal to the first hole injection layer, forming a first electron transport layer on a side of the first light emitting layer distal to the first hole transport layer; forming a first electron injection layer on a side of the first electron transport layer distal to the first light emitting layer; and forming a second electrode layer on a side of the first electron injection layer distal to the first electron transport layer. Optionally, the first electrode layer is a cathode, and the second electrode layer is an anode, and the step of forming the first organic light emitting diode includes forming a first electrode layer on the base substrate; forming a first electron injection layer on a side of the first electrode layer distal to the base substrate; forming a first electron transport layer on side of the first electron injection layer distal to the first electrode layer; forming a first light emitting layer of a first color on a side of the first electron transport layer distal to the first electron injection layer; forming a first hole transport layer on a side of the first light emitting layer distal to the first electron transport layer; forming a first hole injection layer on a side of the first hole transport layer distal to the first light emitting layer; and forming a second electrode layer on a side of the first hole injection layer distal to the first hole transport layer.

In some embodiments, the step of forming the second organic light emitting diode further includes one or more of the following steps: forming a second hole injection layer, forming a second hole transport layer, forming a second electron injection layer, and forming a second electron transport layer. Optionally, the third electrode layer is an anode, and the fourth electrode layer is a cathode, and the step of forming second organic light emitting diode includes forming a third electrode layer on a side of the second electrode layer distal to the first light emitting layer; forming a second hole injection layer on a side of the third electrode layer distal to the second electrode layer; forming a second hole transport layer on side of the second hole injection layer distal to the third electrode layer; forming a second light emitting layer of a second color on a side of the second hole transport layer distal to the second hole injection layer; forming a second electron transport layer on a side of the second light emitting layer distal to the second hole transport layer; forming a second electron injection layer on a side of the second electron transport layer distal to the second light emitting layer; and forming a fourth electrode layer on a side of the second electron injection layer distal to the second electron transport layer. Optionally, the third electrode layer is a cathode, and the fourth electrode layer is an anode, and the step of forming the second organic light emitting diode includes forming a third electrode layer on a side of the second electrode layer distal to the first light emitting layer; forming a second electron injection layer on a side of the third electrode layer distal to the second electrode layer; forming a second electron transport layer on side of the second electron injection layer distal to the third electrode layer; forming a second light emitting layer of a second color on a side of the second electron transport layer distal to the second electron injection layer; forming a second hole transport layer on a side of the second light emitting layer distal to the second electron transport layer; forming a second hole injection layer on a side of the second hole transport layer distal to the second light emitting layer; and forming a fourth electrode layer on a side of the second hole injection layer distal to the second hole transport layer.

In some embodiments, the step of forming the third organic light emitting diode further includes one or more of the following steps: forming a third hole injection layer, forming a third hole transport layer, forming a third electron injection layer, and forming a third electron transport layer. Optionally, the fifth electrode layer is an anode, and the sixth electrode layer is a cathode, and the step of forming the third organic light emitting diode includes forming a fifth electrode layer on a side of the fourth electrode layer distal to the second light emitting layer forming a third hole injection layer on a side of the fifth electrode layer distal to the fourth electrode layer; forming a third hole transport layer on side of the third hole injection layer distal to the fifth electrode layer; forming a third light emitting layer of a third color on a side of the third hole transport layer distal to the third hole injection layer; forming a third electron transport layer on a side of the third light emitting layer distal to the third hole transport layer; forming a third electron injection layer on a side of the third electron transport layer distal to the third light emitting layer; and forming a sixth electrode layer on a side of the third electron injection layer distal to the third electron transport layer. Optionally, the fifth electrode layer is a cathode, and the sixth electrode layer is an anode, and the step of forming the third organic light emitting diode includes forming a fifth electrode layer on a side of the fourth electrode layer distal to the second light emitting layer; forming a third electron injection layer on a side of the fifth electrode layer distal to the fourth electrode layer; forming a third electron transport layer on side of the third electron injection layer distal to the fifth electrode layer; forming a third light emitting layer of a third color on a side of the third electron transport layer distal to the third electron injection layer; forming a third hole transport layer on a side of the third light emitting layer distal to the third electron transport layer, forming a third hole injection layer on a side of the third hole transport layer distal to the third light emitting layer; and forming a sixth electrode layer on a side of the third hole injection layer distal to the third hole transport layer.

Various appropriate light emitting materials and various appropriate fabricating methods may be used to make the light emitting layers of the organic light emitting diodes. For example, a light emitting material may be deposited on the substrate by vapor deposition (e.g., in a fine metal mask vapor deposition process) or by printing. Examples of red light emitting materials include, but are not limited to, 4,4'-Bis(N-carbazolyl)-1,1'-biphenyl doped with 5,6,11,12-tetraphenyltetracene, poly (9,9-dioetyfluorene) doped with Tris[1-phenylisoquinolinato-C2,N]iridium(I), poly (fluorene-alt-Carbazole) doped with Tris[1-phenylisoquinolinato-C2,N]iridium(III), poly (9,9-dioctylfluorene) doped with 5,6,11,12-tetraphenyltetracene, poly (fluorene-alt-Carbazole) doped with 5,6,11,12-tetraphenyltetracene, and polyvinylpyrrolidone doped with Tris[1-phenylisoquinolinato-C2,N]iridium(III). Examples of green light emitting materials include, but are not limited to, 1,3,5-Tris(bromomethyl)benzene doped with N,N'-Dimethylquinacridone, poly (fluorene-alt-Carbazole) doped with Tris(2-phenylpyridine)iridium, poly (fluorene-alt-Carbazole) doped with N,N'-Dimethylquinacridone, and polyvinylpyrrolidone doped with Tris(2-phenylpyridine)iridium. In some embodiments, the blue light emitting material includes a host material and a guest material. Examples of host materials include, but are not limited to, 3-tert-Butyl-9,10-di(naphth-2-yl)anthracene, 9,10-Di(1-naphthyl)anthracene, 4,4'-Bis(2,2-diphenylvinyl)-1,1'-biphenyl, 1,3,6,8-Tetraphenylpyrene, 9,9'-spirobifluorene, 4,4'-Bis(N-carbazolyl)-1,1'-biphenyl, 3,3'-Bis(N-carbazolyl)-1,1'-biphenyl. Examples of guest materials include, but are not limited to 2,5,8,11-Tetra-tert-butylperylene, BCzVBi. 4,4'-[1,4-phenylenedi-(1E)-2,1-ethenediyl]bis[N,N-diphenylbenzenamine].

Various appropriate electron transport materials and various appropriate fabricating methods may be used to make the electron transport layers of the organic light emitting diodes. For example, an electron transport material may be deposited on the substrate by vapor deposition (e.g., in a fine metal mask vapor deposition process) or by printing. Examples of electron transport materials include, but are not limited to, 4,7,-diphenyl-1,10-phenanthroline, 2,9-Bis(naphthalen-2-yl)-4,7-diphenyl-1,10-phenanthroline, 2,9-dimethyl-4,7-diphenyl-1,10-phenanthroline, 8-hydroxyquinoline aluminum, 8-hydroxyquinoline lithiumn, Bis(8-hydroxy-2-methylquinoline)-(4-phenylphenoxy)aluminum, tris(8-quinolinolate)aluminum, 3-(biphenyl-4-yl)-5-(4-tert-butylphenyl)-4-phenyl-4H-1,2,4-triazole, bis(10-hydroxybenzo[h]quinolinato beryllium), and 1,3,5-tris(N-phenyl-benzimiazole-2-yl)benzene.

Various appropriate electron injection materials and various appropriate fabricating methods may be used to make the electron injection layers of the organic light emitting diodes. For example, an electron injection material may be deposited on the substrate by vapor deposition (e.g., in a fine metal mask vapor deposition process) or by printing. Examples of electron injection materials include, but are not limited to, lithium fluoride and 8-hydroxyquinoline lithium.

Various appropriate hole transport materials and various appropriate fabricating methods may be used to make the hole transport layers of the organic light emitting diodes. For example, a hole transport material may be deposited on the substrate by vapor deposition (e.g., in a fine metal mask vapor deposition process) or by printing. Examples of appropriate hole transport materials include, but are not limited to, various p-type polymer materials and various p-type low-molecular-weight materials, e.g., polythiophene, polyaniline, polypyrrole, and a mixture having poly-3,4-ethylenedioxythiophene and poly(sodium-p-styrenesulfonate).

Various appropriate hole injection materials and various appropriate fabricating methods may be used to make the hole injection layers of the organic light emitting diodes. For example, a hole injection material may be deposited on the substrate by vapor deposition (e.g., in a fine metal mask vapor deposition process) or by printing. Examples of appropriate hole injection materials include, but are not limited to, poly(3,4-ethylenedioxythiophene) polystyrene sulfonate (PEDOT:PSS), polythiophene, polyaniline, polypyrrole, copper phthalocyanine and 4,4',4"-tris(N,N-phenyl-3-methylphenylamio)triphenylamine (m-MTDATA).

Various appropriate insulating materials and various appropriate fabricating methods may be used to make the insulating layers of the stacked organic light emitting apparatus. For example, an insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), and silicon oxynitride ($SiO_xN$).

In another aspect, the present disclosure provides a stacked organic light emitting apparatus fabricated by a method described herein. In another aspect, the present disclosure provides an organic light emitting diode array substrate having a stacked organic light emitting apparatus fabricated by a method described herein. In another aspect, the present disclosure provides an organic light emitting diode display panel having a plurality of pixels, each of the plurality of pixels includes the stacked organic light emitting apparatus fabricated by a method described herein. In another aspect, the present disclosure provides an organic light emitting diode display apparatus having the organic light emitting diode display panel described herein. Examples of appropriate display apparatuses include, but are not limited to an electronic paper, a mobile phone, a tablet computer, a television, a monitor, a notebook computer, a digital album, a GPS, etc.

In the present array substrate, display panel, and display apparatus having the stacked organic light emitting apparatus fabricated by a method described herein, at least three organic light emitting diodes are vertically stacked together. The pixel size is significantly reduced because the light emitting area is shared by all three organic light emitting diodes. As a result, the resolution of the image display can be improved by a factor of three.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A stacked organic light emitting apparatus, comprising:
a base substrate; and
at least two organic light emitting diodes;
wherein the at least two organic light emitting diodes comprise:
a first organic light emitting diode comprising a first electrode layer on the base substrate; a first light emitting layer of a first color on a side of the first electrode layer distal to the base substrate; and a second electrode layer on a side of the first light emitting layer distal to the first electrode layer; and
a second organic light emitting diode comprising a third electrode layer on a side of the second electrode layer distal to the first light emitting layer; a second light emitting layer of a second color on a side of the third electrode layer distal to the second electrode layer; and a fourth electrode layer on a side of the second light emitting layer distal to the third electrode layer;
the stacked organic light emitting apparatus further comprising:
a first insulating layer between the second electrode layer and the third electrode layer and insulating the second electrode layer from the third electrode layer;
a gate line;

a first data line;
a second data line;
a first switching thin film transistor for controlling the first organic light emitting diode comprising a first gate electrode, a first source electrode coupled to the first data line, and a first drain electrode coupled to an anode of the first organic light emitting diode; and
a second switching thin film transistor for controlling the second organic light emitting diode comprising a second gate electrode, a second source electrode coupled to the second data line, and a second drain electrode coupled to an anode of the second organic light emitting diode;
wherein the first gate electrode and the second gate electrode are commonly coupled to the gate line;
one of the first electrode layer and the second electrode layer is a cathode of the first organic light emitting diode, another one of the first electrode layer and the second electrode layer is the anode of the first organic light emitting diode;
one of the third electrode layer and the fourth electrode layer is a cathode of the second organic light emitting diode, another one of the third electrode layer and the fourth electrode layer is the anode of the second organic light emitting diode; and
the first data line is insulated from the second drain electrode and a signal line connecting the second drain electrode and the anode of the second organic light emitting diode.

2. The stacked organic light emitting apparatus of claim 1, wherein the at least two organic light emitting diodes further comprises:
a third organic light emitting diode comprising a fifth electrode layer on a side of the fourth electrode layer distal to the second light emitting layer; a third light emitting layer of a third color on a side of the fifth electrode layer distal to the fourth electrode layer; and a sixth electrode layer on a side of the third light emitting layer distal to the fifth electrode layer;
the stacked organic light emitting apparatus further comprising:
a third data line; and
a third switching thin film transistor for controlling the third organic light emitting diode comprising a third gate electrode, a third source electrode coupled to the third data line, and a third drain electrode coupled to an anode of the third organic light emitting diode;
wherein the first gate electrode, the second gate electrode, and the third gate electrode are commonly coupled to the gate line; and
one of the fifth electrode layer and the sixth electrode layer is a cathode of the third organic light emitting diode, another one of the fifth electrode layer and the sixth electrode layer is an anode of the third organic light emitting diode.

3. The stacked organic light emitting apparatus of claim 2, further comprising:
a second insulating layer between the fourth electrode layer and the fifth electrode layer and insulating the fourth electrode layer from the fifth electrode layer.

4. The stacked organic light emitting apparatus of claim 3, wherein
the first data line and the second data line are insulated from the third drain electrode and a signal line connecting the third drain electrode and the anode of the third organic light emitting diode.

5. The stacked organic light emitting apparatus of claim 4, wherein a portion of the second insulating layer is between the first data line and the third drain electrode and between the second data line and the third drain electrode, thereby insulating the first data line and the second data line from the third drain electrode and the signal line connecting the third drain electrode and the anode of the third organic light emitting diode.

6. The stacked organic light emitting apparatus of claim 4, wherein a portion of the second insulating layer is between the first data line and a signal line connecting the third drain electrode and the anode of the third organic light emitting diode, and between the second data line and the signal line connecting the third drain electrode and the anode of the third organic light emitting diode, thereby insulating the first data line and the second data line from the third drain electrode and the signal line connecting the third drain electrode and the anode of the third organic light emitting diode.

7. The stacked organic light emitting apparatus of claim 4, further comprising:
a third insulating layer insulating the first data line from the second drain electrode and the signal line connecting the second drain electrode and the anode of the second organic light emitting diode; and
a fourth insulating layer insulating the first data line and the second data line from the third drain electrode and the signal line connecting the third drain electrode and the anode of the third organic light emitting diode.

8. The stacked organic light emitting apparatus of claim 2, wherein the first electrode layer is the anode of the first organic light emitting diode, the third electrode layer is the anode of the second organic light emitting diode, and the fifth electrode layer is the anode of the third organic light emitting diode.

9. The stacked organic light emitting apparatus of claim 2, wherein the second electrode layer is the anode of the first organic light emitting diode, the fourth electrode layer is the anode of the second organic light emitting diode, and the sixth electrode layer is the anode of the third organic light emitting diode.

10. The stacked organic light emitting apparatus of claim 2, wherein the cathode of the first organic light emitting diode, the cathode of the second organic light emitting diode, and the cathode of the third organic light emitting diode are electrically connected to ground.

11. The stacked organic light emitting apparatus of claim 2, wherein the second electrode layer, the third electrode layer, the fourth electrode layer, the fifth electrode layer, and the sixth electrode layer are transparent electrode layers; and
the first insulating layer and the second insulating layer are transparent insulating layers.

12. The stacked organic light emitting apparatus of claim 2, wherein the first electrode layer, the second electrode layer, the third electrode layer, the fourth electrode layer, and the fifth electrode layer are transparent electrode layers; and
the first insulating layer and the second insulating layer are transparent insulating layers.

13. The stacked organic light emitting apparatus of claim 2, wherein the first electrode layer, the second electrode layer, the third electrode layer, the fourth electrode layer, the fifth electrode layer, and the sixth electrode layer are transparent electrode layers; and
the first insulating layer and the second insulating layer are transparent insulating layers.

14. The stacked organic light emitting apparatus of claim 2, wherein the first color, the second color, and the third color are three different colors selected from the group consisting of red, green, and blue.

15. The stacked organic light emitting apparatus of claim 14, wherein an emission spectrum of the blue light emitting layer minimally overlaps with absorption spectrums of the red light emitting layer and the green light emitting layer; and
an emission spectrum of the green light emitting layer minimally overlaps with an absorption spectrum of the red light emitting layer.

16. The stacked organic light emitting apparatus of claim 1, wherein a portion of the first insulating layer is between the first data line and the second drain electrode thereby insulating the first data line from the second drain electrode and the signal line connecting the second drain electrode and the anode of the second organic light emitting diode.

17. The stacked organic light emitting apparatus of claim 1, wherein a portion of the first insulating layer is between the first data line and a signal line connecting the second drain electrode and the anode of the second organic light emitting diode thereby insulating the first data line from the second drain electrode and the signal line connecting the second drain electrode and the anode of the second organic light emitting diode.

18. A stacked organic light emitting apparatus, comprising:
a base substrate;
a first organic light emitting diode comprising a first anode on the base substrate; a first light emitting layer of a first color on a side of the first anode distal to the base substrate; and a first cathode on a side of the first light emitting layer distal to the first anode;
a second organic light emitting diode comprising a second anode on a side of the first cathode distal to the first light emitting layer; a second light emitting layer of a second color on a side of the second anode distal to the first cathode; and a second cathode on a side of the second light emitting layer distal to the second anode;
a third organic light emitting diode comprising a third anode on a side of the second cathode distal to the second light emitting layer; a third light emitting layer of a third color on a side of the third anode distal to the second cathode; and a third cathode on a side of the third light emitting layer distal to the third anode;
a first insulating layer between the first cathode and the second anode and insulating the first cathode from the second anode;
a second insulating layer between the second cathode and the third anode and insulating the second cathode from the third anode;
a gate line;
a first data line;
a second data line;
a third data line;
a first switching thin film transistor for controlling the first organic light emitting diode comprising a first gate electrode, a first source electrode coupled to the first data line, and a first drain electrode coupled to the first anode;
a second switching thin film transistor for controlling the second organic light emitting diode comprising a second gate electrode, a second source electrode coupled to the second data line, and a second drain electrode coupled to the second anode; and
a third switching thin film transistor for controlling the third organic light emitting diode comprising a third gate electrode, a third source electrode coupled to the third data line, and a third drain electrode coupled to the third anode;
wherein the first gate electrode, the second gate electrode, and the third gate electrode are commonly coupled to the gate line;
the first cathode, the second cathode, and the third cathode are electrically connected to ground;
a portion of the first insulating layer is between the first data line and the second drain electrode, and insulates the first data line from the second drain electrode; and
a portion of the second insulating layer is between the first data line and the third drain electrode and between the second data line and the third drain electrode, and insulates the first data line and the second data line from the third drain electrode.

19. An organic light emitting diode display apparatus, comprising a plurality of pixels, each of the plurality of pixels comprises the stacked organic light emitting apparatus of claim 1.

20. A method of fabricating a stacked organic light emitting apparatus, comprising:
forming a first organic light emitting diode comprising forming a first electrode layer on a base substrate; forming a first light emitting layer of a first color on a side of the first electrode layer distal to the base substrate; and forming a second electrode layer on a side of the first light emitting layer distal to the first electrode layer;
forming a first insulating layer on a side of the second electrode layer distal to the first light emitting layer;
forming a second organic light emitting diode comprising forming a third electrode layer on a side of the first insulating layer distal to the second electrode layer; forming a second light emitting layer of a second color on a side of the third electrode layer distal to the first insulating layer; and forming a fourth electrode layer on a side of the second light emitting layer distal to the third electrode layer;
forming a gate line;
forming a first data line;
forming a second data line;
forming a first switching thin film transistor for controlling the first organic light emitting diode comprising forming a first gate electrode, forming a first source electrode coupled to the first data line, and forming a first drain electrode coupled to an anode of the first organic light emitting diode; and
forming a second switching thin film transistor for controlling the second organic light emitting diode comprising forming a second gate electrode, forming a second source electrode coupled to the second data line, and forming a second drain electrode coupled to an anode of the second organic light emitting diode; and
wherein the first gate electrode and the second gate electrode are formed to be commonly coupled to the gate line;
one of the first electrode layer and the second electrode layer is a cathode of the first organic light emitting diode, another one of the first electrode layer and the second electrode layer is the anode of the first organic light emitting diode;
one of the third electrode layer and the fourth electrode layer is a cathode of the second organic light emitting diode, another one of the third electrode layer and the fourth electrode layer is the anode of the second organic light emitting diode;

the first insulating layer is formed to insulate the second electrode layer from the third electrode layer;

the first data line is formed to be insulated from the second drain electrode and a signal line connecting the second drain electrode and the anode of the second organic light emitting diode.

* * * * *